United States Patent
Bright

(10) Patent No.: US 6,619,999 B2
(45) Date of Patent: Sep. 16, 2003

(54) SOLDERLESS CONNECTOR FOR OPTO-ELECTRIC MODULE

(75) Inventor: Edward Bright, Middletown, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/036,855

(22) Filed: Dec. 31, 2001

(65) Prior Publication Data

US 2002/0115316 A1 Aug. 22, 2002

Related U.S. Application Data

(60) Provisional application No. 60/259,203, filed on Dec. 28, 2000.

(51) Int. Cl.[7] ................................................ H01R 13/42
(52) U.S. Cl. ...................................... 439/751; 439/943
(58) Field of Search ........................... 439/751, 82, 943

(56) References Cited

U.S. PATENT DOCUMENTS

| | | | | | |
|---|---|---|---|---|---|
| 4,904,212 A | * | 2/1990 | Durbin et al. | .............. | 439/943 |
| 5,139,446 A | * | 8/1992 | Costello et al. | ............. | 439/943 |
| 5,743,769 A | * | 4/1998 | Koguchi | ..................... | 439/943 |
| 6,312,296 B1 | * | 11/2001 | Jones | .......................... | 439/943 |

\* cited by examiner

*Primary Examiner*—Gary Paumen

(57) ABSTRACT

An opto-electric module for connection with a printed circuit board having a through-hole comprising: (1) a substrate; (2) an opto-electric device electrically connected to the substrate; and (3) a compliant pin coupled to the opto-electric device and extending from the substrate for electrically connecting the through-hole of the printed circuit board with the opto-electric device. The compliant pin enables the opto-electric module to be electrically coupled to the printed circuit board in a one-step process without exposing the opto-electric device to potentially damaging temperatures associated with soldering.

11 Claims, 3 Drawing Sheets

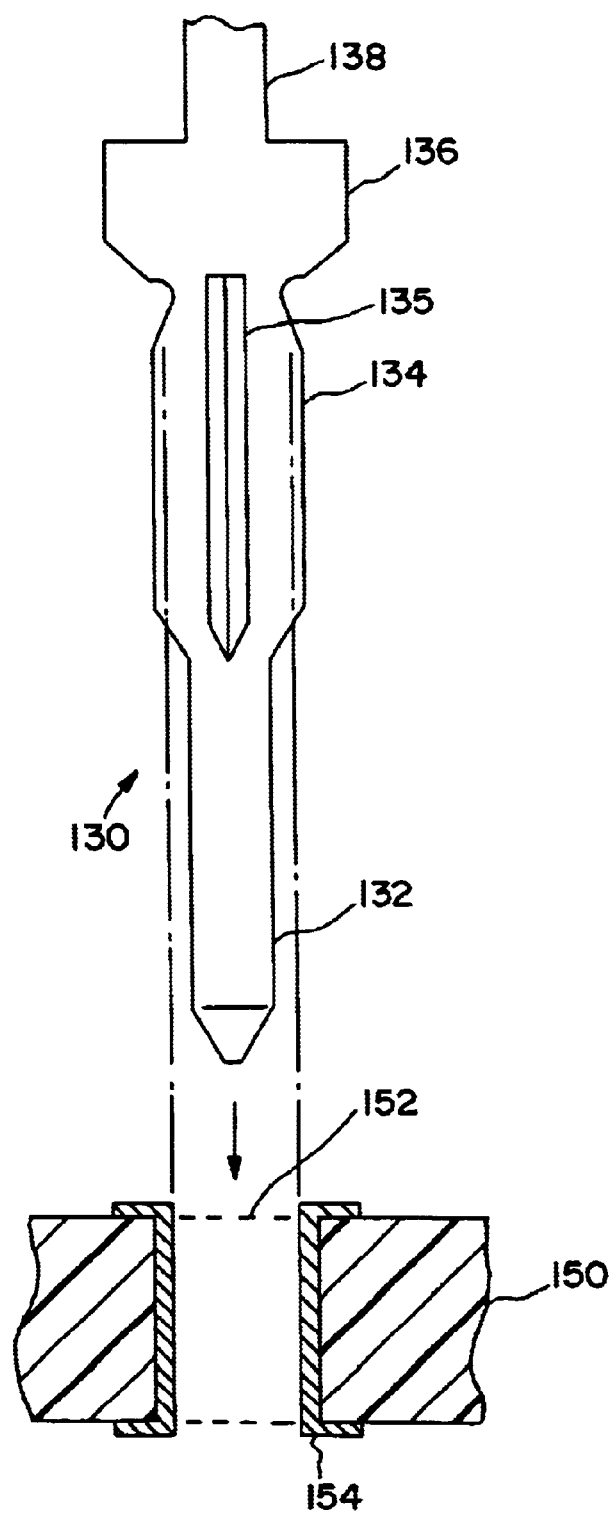
FIG. IA

SOLDERLESS CONNECTOR FOR OPTO-ELECTRIC MODULE

RELATED APPLICATION

Priority of this application is based on Provisional Application No. 60/259203, filed Dec. 28, 2000, and incorporated herein by reference.

FIELD OF THE INVENTION

The present invention relates to electrical connectors, and more particularly to an opto-electric module having a solderless connector for connection to a printed circuit board.

BACKGROUND OF THE INVENTION

Historically, electrical and opto-electric modules have been connected to printed circuit boards with solder pins. Specifically, the printed circuit board is configured with through holes (also referred to herein as "solder-type through holes") which are adapted to receive pins of the opto-electric module. Conventional approaches for soldering the pins to the circuit board include reflow soldering and hand soldering. Although solder reflow is an effective technique for electrically connecting a module to a circuit board, the heat required to achieve reflow tends to be detrimental to heat sensitive devices within the module, such as plastic optical devices which tend to warp or otherwise distort at high temperatures. Furthermore, to ensure that modules are capable of withstanding the environmental conditions associated with reflow soldering, the industry utilizes high temperature materials that add cost to the modules. Since most modules will be used in more moderate climates (e.g., an air-conditioned office building), the modules are therefore "over-engineered" simply to ensure that they can withstand the reflow soldering process. To avoid exposing the module to harsh conditions during reflow soldering, often electronic modules are hand soldered instead to a printed circuit board. The need for hand soldering, however, dramatically increases the cost of system comprising such modules. Aside from the problems associated with soldering the module to the circuit board, there is the added inconvenience that, if a single module fails on a circuit board, which may support many such modules, the entire circuit board must be removed for service. Therefore, there is a need for a solderless connection of a module to a circuit board.

The prior art offers several approaches for forming connections between an opto-electric module and a printed circuit board without subjecting the modules to the high temperatures incident in soldering approaches. These approaches include a socket approach, a spring-bed approach, and a mini-spring socket approach. These approaches, however, suffer from several weaknesses. These weaknesses include, for example, requiring additional components and connection steps, increasing module clearance height and printed circuit board area, and complicating assembly.

The socket approach involves a socket which is soldered to a printed circuit board using traditional techniques. The socket has receiving contacts which are configured to accommodate the solder pins of a traditional opto-electric module. Once the socket is soldered to the circuit board, the opto-electric module is connected to the socket by inserting the pins of the module into the receiving contacts. Since soldering occurs only during installation of the socket on the circuit board, the module is not exposed to potentially damaging high temperatures.

Although the socket approach avoids subjecting the opto-electric module to high temperatures, it presents some complications. For example, the socket involves an intermediate component, i.e., the socket, and an additional step prior to connecting the opto-electric module to the printed circuit board. The additional component and step result in increased material and production costs. In addition, the added component increases the height of a module connected to the printed circuit board. This can be problematic in small form factor configurations. Also, the socket may take up more area on the printed circuit board, which is undesirable for high density circuit boards where minimizing surface area is critical.

The spring-bed approach involves the use of an array of springs positioned on a printed circuit board to receive the pins of an opto-electric module. The opto-electric module is attached to the printed circuit board by mating each pin of the module with a respective spring. Force is then applied to the opto-electric module which compresses the springs to form an electrical contact between the pins and the printed circuit board. While compressed, the opto-electric module is clamped to secure the opto-electric module to the printed circuit board.

The spring-bed approach also avoids subjecting the opto-electric module to high temperature, however, the multi-step spring-bed approach is subject to many of the disadvantages of the socket approach. For example, the springs and clamping mechanism are additional components which add additional steps to the connection process, thereby increasing material and production costs. The additional components also add height to the connected module and increase surface area requirements on the printed circuit board.

The mini-spring socket approach entails inserting a mini-spring assembly configured to receive and secure a solder pin of an opto-electric module into a hole of a printed circuit board. The mini-spring assembly is soldered into place, and then the solder pin of the opto-electric module is inserted into the assembly to effect an electrical connection between the module and the printed circuit board. Although this multi-step approach avoids subjecting the opto-electric module to high temperature, the mini-spring socket approach is not without disadvantages. For example, the mini-spring socket approach adds an insertion step and components which increase costs as discussed above. Additionally, the mini-spring sockets, which are sized to fit within a hole of a printed circuit board, are very small and tend to complicate assembly and increase failure rates.

In addition to the disadvantages associated with the individual approaches discussed above, existing circuit board designs may need to be redesigned and manufacturing equipment may need to be purchased to utilize the prior art approaches discussed above. Since there are currently a large number of printed circuit boards, printed circuit board designs, and machinery to produce them, disposing of existing printed circuit boards, redesigning the printed circuit boards, and retooling or purchasing new machines would be time consuming and expensive.

Accordingly, there is a need for a simplistic approach for electrically connecting an opto-electric module to a printed circuit board using existing machinery and circuit board designs while not subjecting the opto-electric module to high temperatures and without requiring additional components or increasing form factor height or printed circuit board surface area. The present invention fulfils this need among others.

SUMMARY OF INVENTION

The present invention provides for an opto-electric module having compliant pins which are capable of effecting a solderless connection to a printed circuit board. By using compliant pins for connecting to through-holes of the printed circuit board, the opto-electric module of the present invention can be connected to a host printed circuit board in one step without subjecting the opto-electric module to the high temperatures associated with traditional soldering approaches and without requiring additional components or steps. Furthermore, the module of the present invention can be used with the same circuit boards as used for solder pin modules. Preferably, the module of the present invention has the same foot print as its conventional solder pin counterpart and interfaces with the same though-hole circuit board as its solder pin counterpart.

One aspect of the invention is an opto-electric module having compliant pins for connection with a printed circuit board having a through-hole. Preferably, the opto-electric module comprises: (a) a substrate; (b) an opto-electric device attached to the substrate; and (c) a compliant pin coupled to the opto-electric device and extending from the substrate for electrically connecting the through-hole of the printed circuit board with the opto-electric device. Preferably, the opto-electric module further includes an insertion bridge attached to the top surface of the base for directing a force applied to the insertion bridge toward the compliant pin. The insertion bridge facilitates the mating of the compliant pin with the through-hole of the printed circuit board by channeling the insertion force directly to the compliant pin, thereby efficiently using the insertion force to effect a connection.

Another aspect of the invention is an opto-electric apparatus containing the opto-electric module of the present invention. In a preferred embodiment, the opto-electric apparatus comprises: (a) a system card having a circuit board defining at least one solder-type through hole, and (b) an opto-electric module mounted to the circuit board and comprising at least: (i) a substrate; (ii) an opto-electric device attached to the substrate; and (iii) a compliant pin coupled to the opto-electric device and extending from the substrate for electrically connecting the through-hole of the printed circuit board with the opto-electric device.

Yet another aspect of the invention is a process of installing the opto-electric module on a circuit board by pressing the compliant pins of the module into sold-type through-holes of the circuit board. In a preferred embodiment, the process comprises: (a) aligning the compliant pins of the opto-electric module with the though-holes of the printed circuit board; and (b) urging the opto-electric module toward the printed circuit board such that the compliant pins of the opto-electric module enter the through-holes of the printed circuit board and comply to the dimensions of the through-holes to frictionally engage the through-holes of the printed circuit board thereby effecting an electrical connection between the opto-electric module and the printed circuit board.

BRIEF DESCRIPTION OF THE DRAWINGS

FIG. 3 is a flow chard describing the installation of an opto-electric module into a printed circuit board in accordance with the present invention.

DETAILED DESCRIPTION OF THE PRESENT INVENTION

Figure 1:
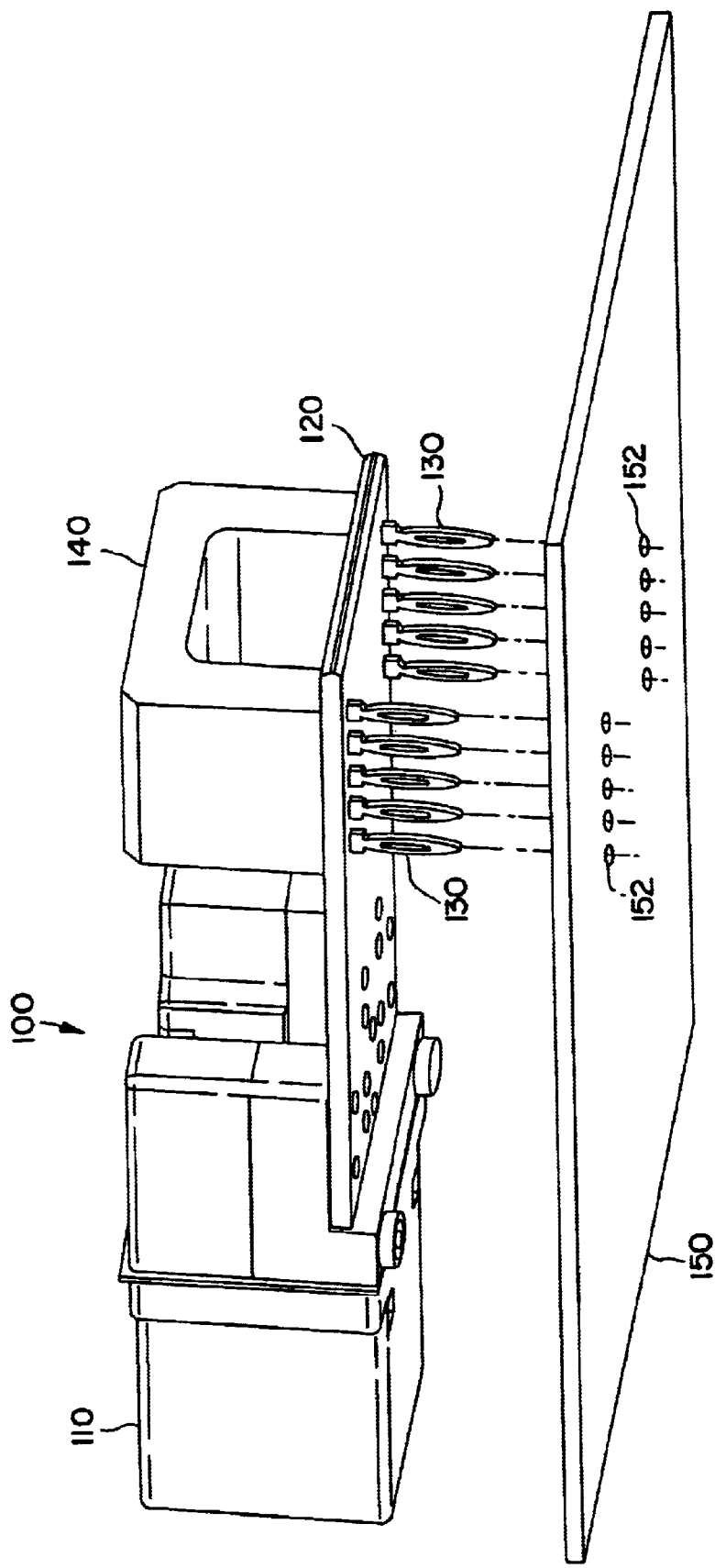
FIG. 1 is a perspective view of a printed circuit board and an opto-electric module in accordance with the present invention.

FIG. 1 depicts an opto-electric module 100 in accordance with the present invention. The module 100 is configured for connection to a host printed circuit board 150 of a host system. Suitable host systems include, for example, routers, switches, computers, or any other system in which an optical-to-electrical or an electrical-to-optical conversion is performed.

The opto-electric module 100 basically comprises an optical connector interface 110, an opto-electric device (OED) (not shown), optics for optically connecting a fiber in the optical connector interface with the OED (not shown), a substrate 120 upon which the OEDs are electrically connected, a plurality of compliant pins 130 for electrically connecting the OEDs to the host circuit board, and, preferably, an insertion bridge 140.

The connector interface 110 may be any conventional device suitable for cooperating with a single or multi-fiber arrays presented in cable assemblies. Suitable interfaces include, for example, adapters/jacks to receive and connect to plugs, plugs to be received in adapters/jacks, and even fiber stubs for fusing/connection with fibers of a cable assembly. Preferably, the connector interface comprises a mechanism that cooperates with the cable assembly to hold the cable assembly secure to the module. Examples of such connector interfaces include adapters for the MT-RJ style connectors and the Lightray MPX™ line of connectors offered by Tyco Electronics Corporation (Harrisburg, Pa.), and for the LC style connectors offered by Lucent Technologies, Inc. Murray Hill, N.J.).

As the term is used herein, "OED" refers to a device which converts electrical current to light and/or light to electrical current. The term "light" refers generally to electromagnetic radiation, and preferably to those wavelengths of electromagnetic radiation to which semi-conductive material is, or can be made, sensitive, whether or not such light is actually visible to the unaided eye. Examples of opto-electronic devices include lasers (e.g., vertical cavity surface emitting lasers (VCSEL), double channel, planar buried heterostructure (DC-PBH), buried crescent (BC), distributed feedback (DFB), distributed bragg reflector (DBR), etc.), light-emitting diodes (LEDs) (e.g. surface emitting LED (SLED), edge emitting LED (ELED), super luminescent diode (SLD), etc.) or photodiodes (e.g., P Intrinsic N (PIN), avalanche photodiode (APD), etc.). With respect to transmitters, preferably the OED comprises a laser chip having a VCSEL and a power monitor, namely, a photodetector. A VCSEL is preferred because it has relatively low cost, uses a surface emission approach which is optically simply, and is capable of being fabricated in larger volumes on semiconductor wafers. More preferably, the OED comprises a ridge VCSEL having formed as a part thereof a vertically integrated PIN photodetector, a vertically integrated MSM photodetector, a laterally integrated photodetector, a separate laterally positioned photodetector, a dual VCSEL and flip chip photodetector, or the like. The OED is a temperature sensitive component and may function improperly if subjected high temperatures, such as those associated with soldering.

The optics for optically coupling the OED to a fiber in the connector interface 110 are known to those skilled in the art and will not be addressed specifically herein. Suffice it to say, however, that these optics tend to be particularly susceptible to heat and often sustain damage in traditional soldering procedures.

As the term is used herein, "substrate" refers to an electronic component having electronic circuit elements mounted thereto or forming part thereof. The substrate may include, for example, a plurality of integrated chips. Such chips may represent, for example, a pre-amplifier or post-amplifier and additional electronic circuits. The type and nature of such circuit elements, and the techniques and methods for mounting such elements to the substrate 120 are well known in the art and do not form part of the present invention. In typical embodiments, the substrate 120 comprises a printed circuit board (PCB), printed wiring board (PWB) and/or similar substrates well known in the art. Preferably, the substrate 120 is a printed circuit board containing traces for coupling the electrical leads of the OED with the compliant pins 130. In alternative embodiments, a hardwired circuit board is used to establish connections between the OED and the compliant pins.

Extending from the substrate 150 are compliant pins 130 which establish a secure and solderless connection with a traditional solder-type through-hole 152 of a printed circuit board 150 simply by being inserted into the through-hole 152. FIG. 1A depicts an exploded cross section of a though-hole 152 of a printed circuit board 150. The through-hole 152 is lined with a metallic plating 154 for facilitating an electrical connection between the printed circuit board 150 and a traditional solder type connection pin. Presently, many host systems are configured for certain host printed circuit boards which employ traditional solder type though-holes and many machines already exist for producing printed circuit boards with these through-holes. Switching to a new through-bole design would require retooling and new manufacturing equipment. Therefore, since the compliant pins of module 100 are preferably compatible with traditional solder-type through-holes, the present invention is particularly advantageous.

The compliant pin 130 is made up of a lead-in section 132, which aligns the compliant pin 130 with the through-hole 152 and guides the compliant pin 130 into the through-bole 152, a compliance section 134, which engages the through-hole 152 of the printed circuit board 150, a shoulder 136, which connects the compliant pin 130 with the substrate 120, and a contacting section 138, which establishes a connection with a trace or wire connection in the substrate 120.

The compliance section 134 has a larger diameter than the diameter of the through-hole 152 and is designed to compress when is enters the through-hole 152. Preferably, the compliance section 134 is made of a resilient material which attempts to expand within the through-hole 152, thereby exerting a frictional force on the through-hole 152 and establishing a secure connection between the compliant pin 130 and the printed circuit board 150. In certain other embodiments, the compliance region is inserted through the through-hole until a portion or all of the compliance region emerges on the opposite side of the through-hole 152 and begins to expand thereby exerting a force on the interior walls of the through-hole 152 and on the back side of the through hole 152.

The compliance section 134 of the compliant pins 130 can have a variety of shapes and styles. In a preferred embodiment, the compliance section 134 contains a notch 135 as depicted in FIG. 1A, although the compliance section may comprise a semi-circular shape or any other traditional compliance configuration. The notch 135 or void created in the pin enables the compliance section 134 to compress to fit within the diameter of the through-hole 152.

The insertion bridge 140 directs a force applied on the insertion bridge 140 toward the compliant pins 130, thereby aiding in the insertion of the opto-electric module 100 into the printed circuit board 150. The insertion bridge 140 is made of a rigid material capable of efficiently transferring forces. In a preferred embodiment, the insertion bridge is attached to the substrate 120 substantially opposite the compliant pins 130 for transferring forces directly to the compliant pins 130. In a preferred embodiment, the insertion bridge is U-shaped, as depicted in FIG. 1, with each side of the "u" positioned directly above a row of compliant pins 130 on an opposite side of the substrate 120. In certain other embodiments, the insertion bridge 140 is solid or has some other shape suitable for transferring forces to the compliant pins 130.

In accordance with certain embodiments, the opto-electric module 100 is covered by a housing. The housing shields the OED and other components coupled to the substrate 120 from environmental conditions such as debris and electromagnetic radiation. The housing is configured to cover the opto-electric module 110 and other portions of the opto-electric module 100 while leaving the compliant pins 130 exposed for connection to the printed circuit board 150. In certain embodiments the housing is rigid and, therefor, is used in place of or in addition to the insertion bridge 140 for inserting the opto-electric module 100 into the printed circuit board 150.

The compliant pins 130 can be inserted into the through-holes 152 of the printed circuit board 150 simply by applying a force to the opto-electric module 100, preferably through the insertion bridge 140. The opto-electric modules 100 incorporating the compliant pins 130 can be used with existing printed circuit board designs and can be inserted into these circuit board using existing machinery. Since existing printed circuit board designs may be used and the opto-electric module 100 can be inserted into these printed circuit boards using existing machinery, waste associated with designing new circuit boards, retooling machinery, and purchasing new machinery is eliminated.

Figure 2:
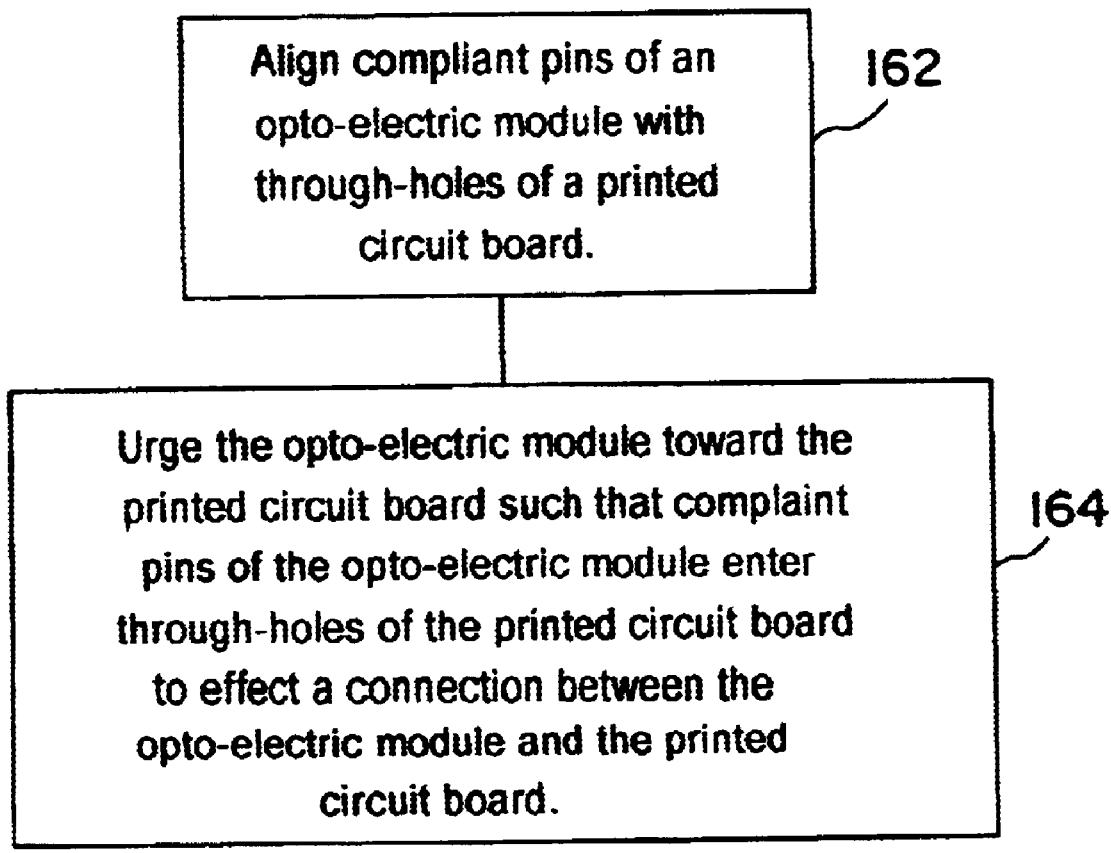
FIG. 2 is a cross sectional view of a printed circuit board through-hole and a compliant pin in accordance with the present invention.

To install the opto-electric module 100 (FIG. 1) of the present invention, the module 100 is inserted into the printed circuit board 150 using the steps depicted in the flow chart of FIG. 2.

At step 162 the compliant pins 130 of the opto-electric module are aligned with the through-holes 152 of the printed circuit board. In a preferred embodiment, the lead in section 132 of the compliant pin 130 is positioned directly above or in the through-hole 152 of a through-hole 152 corresponding to the compliant pin 130.

At step 164, the opto-electric module 100 is urged toward the printed circuit board 150 such that the compliant pins 130 of the opto-electric module 100 enter the through-holes of the printed circuit board 150, thereby effecting a connection between the opto-electric module 100 and the printed circuit board 150. Preferably, the compliance section 134 of the compliant pin 130 complies to the interior dimensions of the through-holes 152 to frictionally engage the through-holes 152 of the printed circuit board 150. The connection is performed in a single step without the use of solder. Therefore, a connection can be simply made between an opto-electric module 100 and a printed circuit board 150 while avoiding high temperatures associated with soldering which could damage the OED.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention.

Accordingly, the foregoing description is by way of example only, and not limiting. The invention is limited only as defined in the following claims and equivalents thereto.

What is claimed is:

1. An opto-electric apparatus comprising:
   a system card having a circuit board defining at least one solder-type through hole, and
   an opto-electric module mounted to said circuit board and comprising at least:
   a substrate;
   an opto-electric device attached to said substrate; and
   a compliant pin coupled to said opto-electric device and extending from said substrate for electrically connecting said through-hole of said circuit board with said opto-electric device.

2. The opto-electric apparatus of claim 1, further comprising:
   an insertion bridge attached to said substrate for directing a force applied to said insertion bridge toward said compliant pin.

3. The opto-electric apparatus of claim 2, wherein said insertion bridge is on an opposite side of the substrate than the compliant pin.

4. The opto-electric apparatus of claim 1, further comprising a rigid housing configured to direct a force applied thereon toward said compliant pin.

5. The opto-electric apparatus of claim 1, wherein said opto-electric device is at least one of a transmitter, a receiver, or a transceiver.

6. The opto-electric apparatus of claim 1, wherein said compliant pin comprises:
   a lead-in section for aligning said compliant pin with said through-hole of the printed circuit board;
   a compliant section having a!resiliently deformable radial cross section for securing said compliant pin within the through-hole of the printed circuit board;
   a shoulder for abutting against said substrate; and
   a contact section for coupling said compliant pin to said opto-electric device.

7. The opto-electric apparatus of claim 6, wherein said compliant section comprises a notch which compresses as said compliant section of said compliant pin is inserted into the trough-hole of the printed circuit board.

8. The opto-electric apparatus of claim 6, wherein said compliant section comprises a semi-circular region which compresses as said compliant section of said compliant pin is inserted into the through-hole of the printed circuit board.

9. The opto-electric apparatus of claim 6, wherein said compliant section comprises a compression region which compresses as said compliant section of said compliant pin is inserted into the through-hole of the printed circuit board.

10. The opto-electric apparatus of claim 1, wherein said opto-electric apparatus is at least one of a router, switch, or computer.

11. The opto-electric apparatus of claim 1, wherein said opto-electric apparatus is a device for processing optical signals.

* * * * *